United States Patent [19]

Raj et al.

[11] Patent Number: 5,206,083
[45] Date of Patent: * Apr. 27, 1993

[54] DIAMOND AND DIAMOND-LIKE FILMS AND COATINGS PREPARED BY DEPOSITION ON SUBSTRATE THAT CONTAIN A DISPERSION OF DIAMOND PARTICLES

[75] Inventors: Rishi Raj; Albert J. Sievers, both of Ithaca, N.Y.

[73] Assignee: Cornell Research Foundation, Inc., Ithaca, N.Y.

[*] Notice: The portion of the term of this patent subsequent to Feb. 2, 2010 has been disclaimed.

[21] Appl. No.: 408,646

[22] Filed: Sep. 18, 1989

[51] Int. Cl.$^5$ .................... C23C 6/26; B32B 33/00
[52] U.S. Cl. .................... 428/323; 428/283; 428/331; 428/408; 428/704
[58] Field of Search ............ 428/408, 323, 283, 331, 428/698, 704, 701, 702; 423/446

[56] References Cited

U.S. PATENT DOCUMENTS

| Re. 29,285 | 6/1977 | Christini et al. | 428/323 |
|---|---|---|---|
| 4,400,410 | 8/1983 | Green et al. | 427/39 |
| 4,403,001 | 9/1983 | Grenier | 428/403 |
| 4,461,750 | 7/1984 | Chess et al. | 423/263 |
| 4,495,044 | 1/1985 | Banks | 204/192 |
| 4,505,746 | 3/1985 | Nakai et al. | 75/243 |
| 4,655,830 | 4/1987 | Akashi et al. | 419/48 |
| 4,695,321 | 9/1987 | Akashi et al. | 75/243 |
| 4,707,312 | 11/1987 | Bajaj | 264/43 |
| 4,707,384 | 11/1987 | Schachner et al. | 427/249 |
| 4,731,296 | 3/1988 | Kikuchi et al. | 428/908.8 |
| 4,744,725 | 5/1988 | Matarese et al. | 428/698 |
| 4,816,286 | 3/1989 | Hisose | 427/39 |
| 4,842,937 | 6/1989 | Meyer et al. | 428/408 |
| 4,844,988 | 7/1989 | Ishizuka et al. | 428/552 |
| 4,900,628 | 2/1990 | Iregaya et al. | 428/698 |
| 4,925,701 | 5/1990 | Jansen | 427/38 |
| 4,939,043 | 7/1990 | Biricik et al. | 428/336 |

FOREIGN PATENT DOCUMENTS

| 0320657 | 6/1989 | European Pat. Off. | |
| 61-163276 | 1/1985 | Japan . | |
| 106494 | 5/1986 | Japan | 428/408 |
| 61-201698 | 9/1986 | Japan . | |
| 62-202897 | 9/1987 | Japan . | |
| 63-277593 | 11/1988 | Japan . | |
| 64-61397 | 8/1989 | Japan . | |
| 1-203293 | 8/1989 | Japan . | |

OTHER PUBLICATIONS

Deutchman et al "Dual Ion beam Deposition of Diamond Films on Optical Elements" SPIE vol. 1146 Diamond Optics II (1989) pp. 124–134.
Ma et al "Selective Nucleation and Growth of Diamond Particles by Plasma-Assisted Chemical Vapor Deposition" Appl. Phys. Lett. vol. 55, No. 11, Sep. 1989.
Hirabayashi et al "Selective Deposition of Diamond Crystals by CVD Using Tungston-Filament Method" App. Phy. Lett vol. 53, No. 19 Nov. 1988.
Joffreau et al. "Low Pressure Diamond Growth on Refractory Metals" R & HM, Dec. 1988 pp. 186–194.
Singh et al "Effects of Filaments and Reactor Wall in Low-Pressure CVD Synthesis of Diamond" App. Phys. Lett vol. 56 No. 6 Feb. 1988, pp. 451–452.
Kobashi et al "Synthesis of Diamonds by Use of Microwave PCVD:Morphology and Growth of Diamond Films" Physical Review B, vol. 38, No. 6, Aug. 1988.
Matsumoto, S. et al, *Journal of Materials Science*, 17:3106–3112 (1982).
Matsumoto, S., *Journal of Materials Science Letters*, 4:600–602 (1985).
Sawabe, A. et al, *Thin Solid Films*, 137:89–99 (1986).

(List continued on next page.)

Primary Examiner—Ellis P. Robinson
Assistant Examiner—Archene Turner

[57] ABSTRACT

Novel diamond thin films deposited on a metal or ceramic composite comprising a matrix having dispersed therein finely divided diamond or diamond-like particles are useful in improving the erosion resistance of materials used for long wave infrared transmitting applications such as domes and infrared windows.

12 Claims, 5 Drawing Sheets

OTHER PUBLICATIONS

Badzian, A. R. et al, *Mat. Res. Bull.*, 23:531–548 (1988).
Badzian, A. R., *Mat. Res. Bull.*, 23:385–400 (1988).
Okano et al, *Japanese Journal of Applied Physics*, 27:L173–L175 (1988).
Singh, Bhanu Pratap, *J. Mater. Sci.*, 22:2407–2410 (1987).
Raj, Rishi, *Cornell Engineering Quarterly*, 23, No. 2, 7–14 (1989).
Xue, et al, Acta Metall Mater., vol. 38, No. 9, 1743–1752 (1990) "Optical and Mechanical Properties of Zinc Sulphide Diamond Composites".
Noh et al, Optics Letters, OV1. 14, No. 22, 1260–1262 (1989) "Investigation of the Infrared Properties of ZnS:diamond composites".
Fitzgerald, et al, Physical Review 3, 42, No. 9, 5469–5475 (1990) "Far-infrared investiations of the generalized Lyddone–Sachs–Teller relation using ZnS–diamond composites".
Xue et al, J. Am. Ceram. Soc. 73(8), 2213–2216 (1990) "Effect of Diamond Dispersion of the Superplastic Rheology of Zinc Sulfide".
Xue et al, Appl. Phys, Lett., 58(5) 441–443 (1991) "Effect of hot pressing temperature on the optical transmission of zinc sulfide".

DIAMOND AND DIAMOND-LIKE FILMS AND COATINGS PREPARED BY DEPOSITION ON SUBSTRATE THAT CONTAIN A DISPERSION OF DIAMOND PARTICLES

This invention was made in part with Government support under Grant ONR Contract No. N0014-87-K-0527. The United States has certain rights to this invention.

The instant invention relates to novel diamond thin films deposited on a metal or ceramic composite comprising a matrix having dispersed therein finely divided diamond or diamond-like particles.

BACKGROUND OF THE INVENTION

There is a need for improving the erosion resistance of current materials used for long wave infrared transmitting applications such as domes and infrared windows. (Report of the Committee on Mechanical Properties of Infrared Transmitting Materials, Publication NMAB-336, National Academy of Sciences, 1978). A number of materials that transmit infrared (IR) at wavelengths longer than 8 micrometers (halides, sulfides, arsenides, selenides, gallium arsenide, III-V and II-VI compounds) generally suffer from weak mechanical durability which limits their usefulness. It has now been found that composites having improved toughness and durability can be fabricated by uniformly dispersing small particles of diamonds in an appropriate matrix.

Diamond films and coatings have many uses including wear resistant parts, semiconductor devices, infrared, and diamond-like windows, electronic applications and radomes. There is on-going need to improve the strength of such films and their integrity against environmental degradation.

Diamond films have been grown on various substrates by vapor deposition methods. U.S. Pat. No. 4,816,286 (Hirose) teaches a method for synthesis of diamond by gas decomposition of an organic compound on the surface of a substrate by heat, electron beam, light, direct current glow discharge, alternating current glow discharge or direct current arc discharge.

Matsumoto et al (*Journal of Material Science*, 17:3106–3112 (1982)) grew microcrystals of diamond on silicon, molybdenum and silica substrates by vapor chemical deposition of hydrocarbon/hydrogen mixtures with a hot tungsten filament. As recited in that article, other methods of preparing chemical films include ion-beam deposition, sputtering, and plasma CVD. Matsumoto, S. (*J. Materials Science Letters*, 4:600–602 (1985)) described a RF discharge activation method for depositing diamond microcrystals or silicon wafers, molybdlenum and silica-glass plates using a hydrogen/methane mixture.

Sawabe et al (*Thin Solid Film*, 137:89–99 (1986)) grew tin diamond films on silicon and SiC by electron-assisted chemical vapor deposition (EACUD). The growth of diamond films on these substrates is believed to be limited by the nucleation of diamond crystals. For example, it is now well recognized that the growth of the diamond films is enhanced by the presence of diamond particles that are left behind on the surface of silicon wafers when the wafers are polished with diamond paste (Okano et al, *Japanese Journal of Applied Physics*, 27(2):1173–1175 (1988)); these particles of diamond serve as the nuclei for the growth of the diamond films.

The present invention relates to diamond composites including infrared transmitting composites, their preparation and to improved diamond or diamond-like coatings.

BRIEF SUMMARY OF THE INVENTION

An object of the present invention is to provide improved composites for infrared and other applications including infrared windows, radomes, semiconductors, electronic and optoelectric components and the like which transmit infrared light at wavelengths longer than 8 micrometers, preferably from about 8 to 15 micrometers wherein said composites comprise uniform dispersion of diamond particles preferably at lateral distances from about 0.01 to about 10.0 $\mu$m in a matrix having infrared transmission properties similar to that of diamond and which transmit infrared light at wavelengths from about 1 micrometer up to at least 10 micrometers.

A further object of the present invention relates to a composite and process for preparing same which comprises a dispersion of finely divided diamond or diamond-like particles preferably of particle size from about 0.1 to about 10.0 and more preferably 0.1 to 5.0 micrometer diameter in an infrared transmitting matrix, such as zinc sulfide, wherein the composite transmits infrared light and exhibits improved toughness and durability 2 to 4 times that of the similarly treated matrix alone.

A yet further aspect of the present invention comprises such infrared transmitting composites having increased thermal shock resistance by having diamond particles dispersed in a matrix at diamond concentrations of from 1 to 75 volume percent.

Another object of the present invention relates to improved diamond thin films and especially those deposited on a metal or ceramic composite comprising a matrix having dispersed therein finely divided diamond or diamond-like particles at a concentration of from about 0.1 volume percent to about 75 volume percent and preferably from about 1 to 30 volume percent wherein at least one surface of the composite on which the diamond is deposited has diamond nuclei uniformly positioned on the surface at lateral distances from about 0.01 to 5.0 $\mu$m, preferably from about 0.5 to 2.0 $\mu$m, sufficient to promote the formation of integrated diamond film thereon; and wherein said films and coatings are deposited by conventional deposition methods including chemical vapor deposition.

BRIEF DESCRIPTION OF THE DRAWINGS

As shown in FIG. 1, diamond particles constituting particles of hard phase 10 are dispersed in a soft phase (matrix) 12 under microcracking condition (9/4) $(Y^2z/E) \geq \gamma_s$, and plastic deformation is indicated by reference numeral 14 and interface microcracking is indicated by reference numeral 16.

In FIG. 3A, scale line 18 represents 200 μm, and in FIG. 3B, scale line 20 represents 40 μm.

DETAILED DESCRIPTION OF THE INVENTION

It has now been found that the mechanical properties of useful long wave infrared transmitting materials can be improved by fabricating a composite comprising a matrix and small diamond particles dispersed therein. The optical properties of such composites were not adversely affected.

Figure 1:
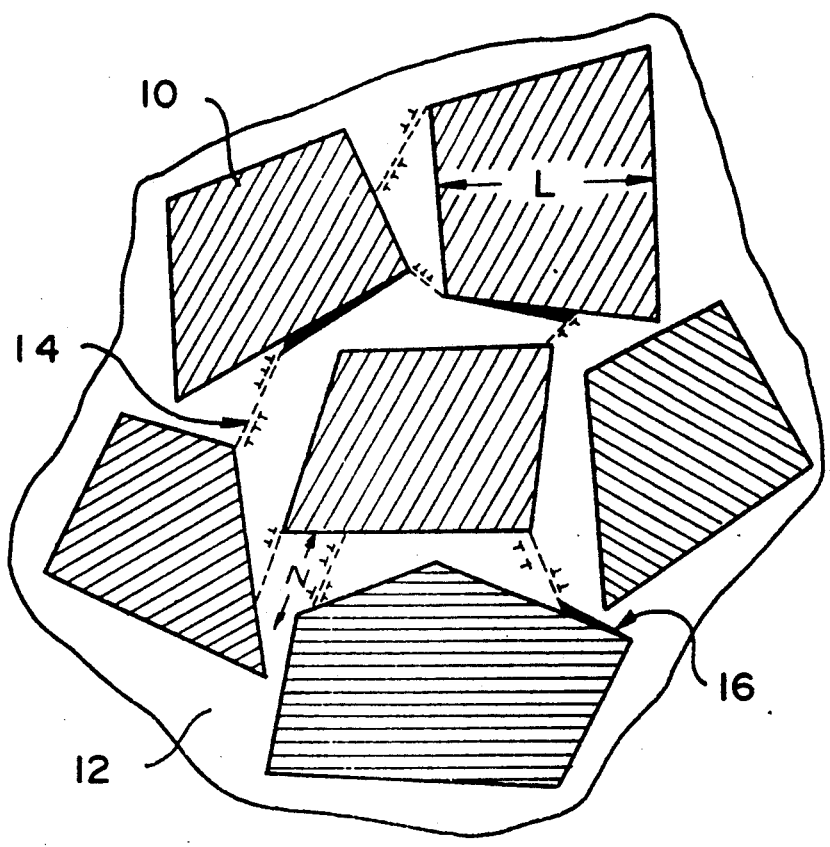
FIG. 1 is a schematic illustration of the composite showing how diamond particles dispersed in an infrared transmitting zinc sulfide matrix toughen the composite by inducing multiple microcracking.

Diamond is unusual in its optical and mechanical properties. It is both transparent in the infrared and mechanically one of the hardest materials known to man. The ideal infrared material would be monolithic diamond. The diamond toughens the matrix by dispersing plastic deformation in the matrix and by inducing multiple microcracking as illustrated schematically in FIG. 1. Broadly, the matrix can comprise virtually any synthetic organic or inorganic binder.

The composite useful in the present invention can be prepared from a wide range of matrices, for example, preferably those that transmit in the infrared at wavelengths from about 1 micrometer to at least 10 micrometers. Such matrices include halides, sulfides, arsenides, selenides, III-V compounds, II-VI compounds and the like. The preferred elements, alloys and/or compounds prepared therefrom included zinc, selenium, thorium, arsenic, thorium, sulfur, chlorides and bromides. Selenium glass is an example of an element matrix. Useful compounds include $As_2S_3$ glass, zinc sulfide, selenium sulfide, thorium bromide, thorium chloride and thorium tetrafluoride zinc sulfide/zinc selenide is a preferred alloy matrix. Preferred matrices are those that are similar to or match the refractive index of diamond in the range of from about 2.0 to 2.8 and more preferably from about 2.1 to about 2.6.

Useful composites comprise matrix and volume fractions of diamond particles ranging from about 1 to above 75 percent. The composition will depend in part on the properties desired. Composites having lower volume fractions of diamond particles, preferably in the range of from about 1 to 30 percent will be useful where medium toughness is desired. The thermal conductivity of the composite increases with diamond volume content. When high toughness and/or high thermal conductivity is required (improved shock resistance), the composite will be fabricated using high volume fractions of diamond particles i.e. up to 75 percent volume fraction of diamond. The diamond particle size in the 0.01 μm to 5.0 μm range is preferred because particles that are much larger than 5.0 μm will induce scattering of infrared light while those that are much smaller than 0.01 μm will be difficult to disperse uniformly in the matrix due to agglomeration.

Composites having high volume fractions (60+ percent diamond) need to be fabricated under somewhat different processing conditions. It will be recognized that different processes can be used to fabricate such composites. Various processing techniques known to the composite art will be useful in preparing the composites having high diamond content. For example, diamond particles can be coated with a thin layer of matrix i.e. zinc sulfide by a wet precipitation or by chemical vapor deposition in order to obtain satisfactory dispersion of the diamond particles during the hot pressing step. The material deposited does not have to be the same material as the matrix as long as it is compatible therewith and does not impart undesirable properties or interfere with the IR transmission properties of the composite. A preferred method for incorporating high volume fractions of diamond with zinc sulfide matrix is a chemical vapor deposition (CVD) process where the zinc sulfide and diamond are codeposited on a substrate to give a ready-to-use material. Net shape processing of the diamond composites can be carried out by either hot-pressing, or by chemical vapor deposition, or by a process that employs both hot-pressing and chemical vapor deposition. The diamond composite material provides a nearly ideal substrate for the growth of diamond films by CVD methods since the diamond particles embedded in the composite can serve as nuclei for the growth of the diamond or diamond like films from hydrogen and hydrocarbons. The diamond films provide additional mechanical protection to the material. Multilayer configurations that have alternating layers of diamond films and the particulate composites can further enhance the mechanical reliability.

Particulate composites comprising zinc sulfide and diamond were prepared by mixing powders of zinc sulphide and diamond and hot pressing at temperatures ranging from 800° C. to 1050° C. for a period that ranged from 10 minutes to 10 hours. The hot pressing was carried out in an inert or reducing atmosphere. Dies made from the alloy TZM (titanium-zirconium-molybdenum) were used.

The particle size of the zinc sulfide powders ranged from 0.05 micrometers to 50 micrometers, while the diamond powders ranged from 0.1 micrometers to 10.0 micrometers in diameter. The powders were mixed by shear milling and freeze-milling to obtain an intimate mixture and dispersion.

Zinc sulfide has two phases in the solid state. The stable phase below about 1020° C. is the β phase. Above that temperature, α is the stable phase. The refractive index of the phase is better matched to diamond than the β phase. By deformation processing near the phase transition temperature the α phase can be metastably retained at room temperature. This can further improve the optical properties of the composite. Although the matrix material for the diamond composites is not limited to zinc sulfide, it is a preferred matrix because its refractive index and infrared transmitting properties are close to those of diamond.

The composites of the present invention are useful in apparatus requiring material or windows that transmit infrared light above 8 micrometers and preferably from about 8 to about 15 micrometers. The composites having uniformly dispersed diamond particles up to volume percent of about 75 percent based on the matrix are particularly advantageous in providing mechanical stability and toughness much in excess of the windows prepared from the matrix material alone. As the diamond particle concentration increases, the resulting composites will have increased thermal conductivity properties in addition to the improved toughness qualities and infrared transmission properties. For maximum thermal conductivity, diamond particle concentrations of from 30 to 75 volume percent are useful. The composites will be advantageous for scanning devices, and military apparatii where infrared transmitting windows having excellent mechanical properties are required. The composites having the desired properties set forth above will be particularly useful in missile technology and optoelectronic devices.

Infrared transmitting windows can be fabricated using various techniques such as for example, melt-solidification, particulate consolidation and chemical vapor deposition (CVD). Particulate consolidation methods are advantageous for preparing the instant composites. Following fabrication, the composites may be further finished depending on the intended use and the exposure conditions. For radome, infrared window and FTIR applications other layers or films of infrared material may be applied. Known fabricating techniques can be used for semiconductor and for microelectronic applications.

One aspect of the invention relates to composites comprising diamond particles dispersed in a matrix that comprises an infrared transmitting material preferably one that is transparent to infrared wavelength from about 1 to at least 10 micrometers. Examples of suitable matrices for this purpose include zinc sulfide, zinc selenide, barium monosulfide, calcium sulfide, calcium fluoride, magnesium sulfide, cadmium telluride, gallium arsenide, thorium chloride, thorium iodide, thorium tetrafluoride, zinc oxide, arsenic trisulfide and tin iodide. Zinc sulfide is a preferred matrix because of its refractive index, infrared transmittance and other properties. Also suitable for this purpose are alloys such as for example zinc sulfide/zinc selenide alloy.

Also contemplated by the present invention are composites comprising finely divided diamond particles dispersed in a matrix which does not have to be itself an infrared window or infrared transmitter. Examples of suitable matrices for this purpose include titanium, zinc, selenium, silicon, zirconium, nickel, titanium, magnesium, copper, aluminum and various oxides thereof; various polymers, both organic and inorganic; glasses, ceramics and mixtures thereof; silicon, silicon nitride ($Si_3N_4$); silicon carbide; graphite; boron nitride (BN); and berrylium oxide. The term ceramic is used in its broad sense to include nitrides, borides, carbides, silicides, selenides, halides and sulfides of the above listed elements, all of which can have uniform dispersion of diamond particles and which additionally will be useful as substrate for thin film diamond deposition. When infrared transparent substrate are not required, the matrix can comprise organic binders, inorganic binders or combinations thereof. Organic matrices can be polymeric organics such as for example polyolefins, polystyrenes, polyurethane and the like. Examples of inorganic binders matrices include for example WC, NaCl, Si, SiC, $SiO_2$, $TiO_2$, $ZrO_2$, $Al_2O_3$, Cu, Mo, W and the like.

Soluble metal halides such as sodium chloride are advantageous when it is desired to have sacrificial substrate and to isolate a deposited thin film or layer of diamond by dissolving away the base substrate material.

The size of the matrix particles and processing conditions will depend on the matrix material selected and the end use of the composite. Preferably matrix particle size is from about 0.1 $\mu$m to about 100 $\mu$m.

Deposition of Diamond Films

The present invention also relates to the deposition of diamond film by Chemical Vapor Deposition (CVD) and other methods known to the art wherein the film is deposited on specific substrates including the composites described herein. The novel composites comprise a suitable matrix having dispersed therein small diamond particles preferably at particle size of from about 0.01 micrometers to about 5.0 micrometers at volume percent of from about 1 to about 30 and up to 75 volume percent when products having high strength and/or high thermal conductance are required. The size of the matrix particles and processing conditions will depend on the matrix material selected. Preferably, matrix particle sizes are from about 0.1 $\mu$m to about 100 $\mu$m.

The terms diamond and diamond-like are used interchangeably in this application to include films or particles that substantially possess the hardness of the diamond molecular structure without necessarily possessing the ideal molecular structure. The term diamond includes all forms of diamond particles including powders, flakes and the like.

A typical composite preparation comprises intimately mixing the diamond particles with the matrix material, forming into a mold and heating the mixture at a temperature from about 0.4 of the melting point of the matrix to about 0.95 of the melting point of the matrix under an applied pressure of from about 1 bar to about 10 kbar. The composites are prepared by conventional, well established, powder processing followed by sintering or hot-pressing or hot-isobaric pressing. Since the quality of the diamond film depends upon a uniform distribution of diamond nuclei in the matrix, it is desirable that the particles of the matrix and the diamond should be intimately mixed before high temperature consolidation.

Figure 5A:
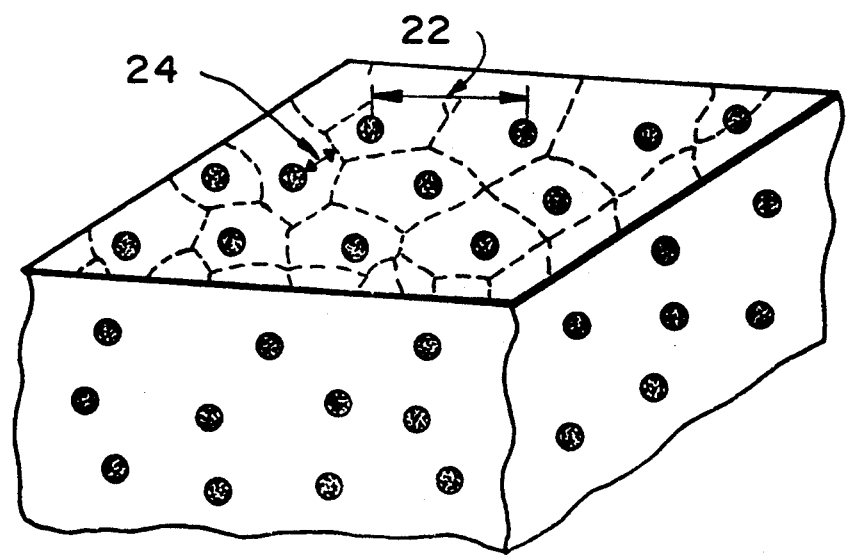
FIG. 5A schematically shows the uniformity of the dispersed diamond particles in a zinc sulfide matrix whereby growth of a diamond film on the composite results in a uniform film and illustrates how the spacing of the particles on the surface can be regulated by choice of particle size and volume fraction of the dispersed particles. The spacing between particles, λ, is represented by the span denoted by reference numeral 22, and the average lateral growth distance (λ-p)/2 where p is the diameter of diamond particles, is represented by the span denoted by reference numeral 24.
Figure 5B:
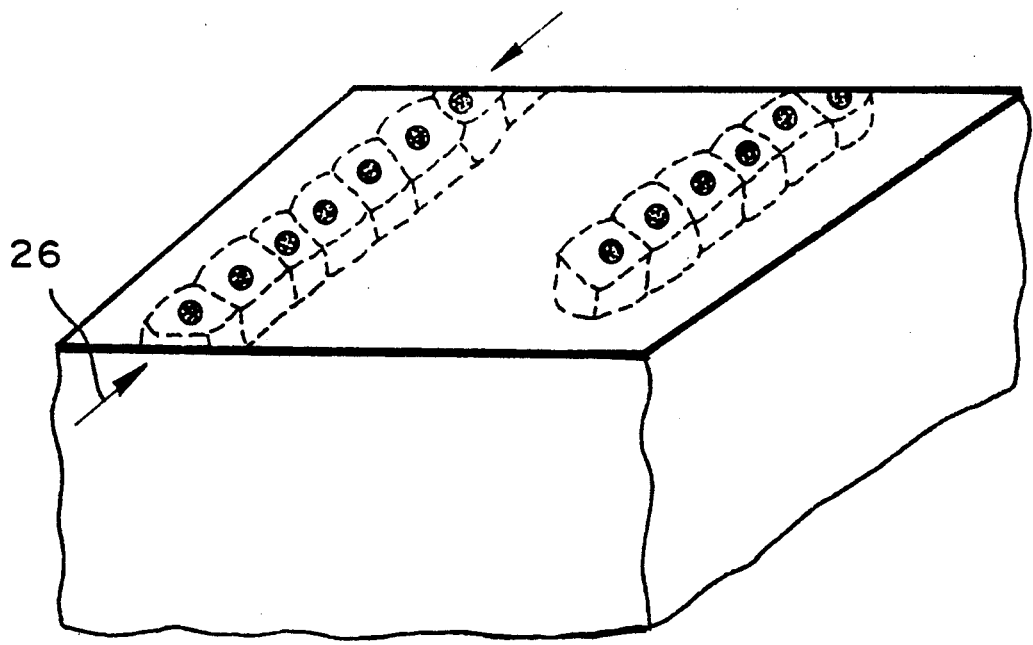
FIG. 5B schematically depicts a substrate containing a scratch filled with diamond particles as indicated by reference numeral 26, where growth of a diamond film on the substrate scratched with diamond particles results in a non-uniform film.

As shown in FIG. 5, the diamond particles are dispersed throughout the matrix. Such dispersion provides a substantially uniform distribution of diamond nuclei for the growth of diamond films. The diamond dispersed composites are superior to the prior art substrate, such as for example those with surface prepared by scratching with a diamond paste, because the diamond film becomes intimately bonded with dispersed composite matrix.

Diamond coated substrate wherein the composite having small diamond particles dispersed therein can function as an infrared window for infrared trasmision applications. Such composite is fabricated from a matrix having suitable infrared transmission properties and preferably a refractive index which substantially matches that of diamond i.e. 2.0 to about 2.8 and preferably from 2.10 to 2.60. Suitable matrixes for this purpose include for example elements and compounds which can transmit infrared light having a wavelength of from about 1 micrometers up to at least 10 micrometer. Such matrices having useful infrared properties include for example, zinc sulfide, zinc selenide, barium monosulfide, calcium sulfide, calcium fluoride, magnesium sulfide, magnesium oxide and fluoride, calcium telluride, strontium monosulfide, thallium chloride, thorium oxide, thorium fluoride, zinc oxide, arsenic trisulfide and tin iodide (ic).

A further aspect of the invention relates to diamond coated substrate where the substrate does not have to be itself an infrared window or infrared transmitter. One skilled in the art will recognize that composites for this aspect of the invention will comprise finely divided diamond particles dispersed in a wide variety of matrices for the purpose of providing surface diamond nucleation sites to facilitate the formation of the diamond coating thereon. Indeed such matrices containing uniformly dispersed diamond particles can be fabricated from a variety of matrix substances and mixtures known to those skilled in the art and useful for electronic and optical applications. Examples of suitable matrices which are not required to be infrared transmitter per se include titanium, zinc, silicon, zirconium, nickel, titanium, magnesium, copper, aluminum and various oxides thereof; various polymers, both organic and inorganic; glasses ceramics and mixtures of glasses and ceramics; silicon nitride ($Si_3N_4$); silicon carbide; Boron nitride (BN); berrylium oride and graphite. The term ceramic is used in its broad sense to include oxides, carbides, nitrides, borides, selenides, halides and sulfides of the above listed elements which can be used for fabricating the substrate needed for thin film diamond deposition. Soluble metal halide compounds such as sodium chloride will be advantageous matrices when it is desired to have a sacrificial substrate and to isolate the diamond layer by dissolving away the base composite material.

One skilled in the art will recognize that small layers of the diamond deposited composite can be used on top of other substrate not containing the dispersed small particles of diamond. For example, one may use a $SiO_2$ or $Al_2O_3$ base having a layer of composite comprising finely divided particles of diamond dispersed in a zinc sulfide matrix. Numerous other combinations will be apparent to one skilled in the art as required for specific optical or electronic applications.

A uniform dispersion of particles will give films of higher quality and of uniform thickness. Indeed, the distance between the nuclei can be controlled by changing the particle size and the volume fraction of diamond particles in the matrix. The particle size, p, the spacing between the particles (see reference numeral 22 in FIG. 5A), $\lambda$, and the volume fraction of the diamond particles, $v_d$, are related by the following equation:

$$V_d = (P/\lambda)^2$$

The table below gives the relationships between the above quantities:

| $\lambda$ Particle Spacing on the Surface | p Particle Size | $v_d$ Volume Fraction | $(\lambda-p)/2$ Lateral Growth Distance |
|---|---|---|---|
| 2.0 μm | 0.2 μm | 1.0% | 0.9 μm |
| 1.0 μm | 0.1 μm | 1.0% | 0.45 μm |
| 0.5 μm | 0.1 μm | 4.0% | 0.2 μm |
| 1.0 μm | 0.3 μm | 9.0% | 0.35 μm |
| 5.0 μm | 2.0 μm | 16.0% | 1.5 μm |
| 2.0 μm | 1.0 μm | 25.0% | 0.5 μm |

The lateral growth distance, $(\lambda-p)/2$, is the distance by which the nuclei must grow before the film becomes continuous. The smaller this distance the better; the uniformity of the dispersion is important. Powder processing techniques employed to make the diamond dispersed material determines the smallest possible spacing that is possible while maintaining a sufficiently uniform dispersion.

The thickness of the diamond film deposited on the diamond composite will generally vary from a thickness of from about 0.05 micrometer to about 1000 micrometer depending on the intended use. Preferred thickness of the diamond film are from 0.1 micrometer to 100 micrometer.

A wide variety of materials for optical, electronic and structural applications can be fabricated from the unique composites and diamond coated composites. The unusual properties of diamond composites and diamond coated diamond composites make them particularly useful for the following applications:

Optical Applications

A composite of zinc-sulfide and diamond particles are useful for infrared window applications. The optical properties of the composite are comparable to that of pure zinc sulfide but the mechanical toughness is two to four times greater. The mechanical endurance of the composite can be further improved by depositing a coating of diamond by the CVD process. The diamond particles embedded in the composite will serve as the nuclei for the growth of the diamond film.

Often the failure of such infra red transmitting substances is caused by thermal shock. Because of the diamond content, higher thermal conductivity of the composite reduces the likelihood of thermal shock failure. The diamond coating as well as the dispersion of diamond in the matrix increases the thermal conductivity of the composite.

Other matrices can be substituted for the zinc sulfide matrix when it is important that the composite have infrared transmitting the properties to transmit infrared having light of wavelength of from about 8 micrometers to 15 micrometers. For such purposes it is preferred that the matrix in which the diamond particles are imbedded have an refractive index that substantially matches the index of refraction of diamond. Useful matrices for this purpose include those listed above.

Electronic Applications

Ceramic and polymer substrates for electronic packaging applications can be improved by making composites with diamond particles and by coating these composites with diamond films. Such composites, with or without the diamond coating, will have higher thermal conductivity, better mechanical properties and better surface scratch resistance. Also, diamond is known to bond easily to metals; therefore, the composites will be easier to metallize.

The composites for electronic packaging applications can be made from different materials; for example: alumina, zirconia, polymers, glass ceramics, glasses, and composites of glasses and ceramics. All of these can be dispersed with diamond particles and coated with diamond films.

Structural Applications for Better Wear Resistance

Diamond is the hardest material known to man. Coatings of hard materials such as titanium-nitride are commonly applied to surfaces that are subject to wear, for example, cutting tools, gas turbine blades, etc. The procedure disclosed in this invention can be generally used to produce diamond coatings on materials that contain a dispersion of diamond particles.

Examples of materials that can be improved by this invention include ceramics (oxides, nitrides, borides) metals and intermetallics (for example, nickel base alloys, aluminides and silicides).

Self Standing Diamond Films

Self standing diamond films, up to 1 cm thick, and in a variety of contours can be fabricated by this method by first growing the films on a shaped substrate dispersed with diamond particles and them removing the substrate by chemical etching. The substrate can be shaped by sintering, hot-pressing, hot-isostatic-pressing, or sinterforging. Examples of substrate materials include copper, nickel, magnesium oxide, sodium chloride, etc.

The diamond films of the instant invention can be deposited by any of the methods known to the art. Presently it is preferred to grow the diamond films by Chemical Vapor Deposition (CVD) methods. The diamond particles that are dispersed in the composite serve as the nuclei for the growth of the ceramic film, making it much easier to grow the diamond coatings, on a wide variety of materials.

Similarly the composites comprising matrix having finely divided diamond particles dispersed therein can be fabricated by known methods. Because of its simplicity and cost advantage, powder pressing methods are preferred. The temperature, pressure and fabrication conditions will vary depending on the choice of matrices and the intended use of the coated composite.

The following specific examples are provided to generally illustrate the invention. One skilled in the art will appreciate that various modifications of the process can be made within the broad aspects of the invention. All percentages are by weight, all temperatures are degrees centigrade, and pressures are given in bar units (1 bar=14.5 psi) unless otherwise specified.

EXAMPLE 1

ZINC SULFIDE/DIAMOND (10%) COMPOSITE

Two grams diamond particles (General Electric, Synthetic) having a particle size of 0.1 to 1 micrometer was chemically cleaned with HF and washed with deionized water. To achieve homogeneous dispersion of diamond particles in zinc sulfide, several mixing steps were applied. Firstly, the chemically cleaned diamond suspension (in about 50 ml water) was mixed with zinc sulfide by adding 18 grams of zinc sulfide powder (General Electric, 99.9%) having an average particle size of 0.6 micrometers. During the whole process, the suspension was alternatively magnetic-bar stirred and ultrasonic agitated. The suspension was then allowed to settle and the excess water was siphoned out. In the second step, the diamond/zinc sulfide paste obtained was shear mixed for 5 min. in a Stomacher blender. The above processing procedures were all carried out at room temperature. The mixture was then dried by infrared heating. Finally, the powder was impact milled under liquid nitrogen for a total time of 5 min. using a freeze miller.

About one gram of the composite mixture was loaded in a TZM alloy die of 11 mm in diameter and hot-pressed for 30 min. at a pressure of 200 MPa and at a temperature of 1000° C. The hot-pressing atmosphere was mixed gases of He+4% $H_2$. Graphite foil was used to separate the specimen from the die material. After hot-pressing, the die was furnace cooled and the composite removed from the die. The surfaces of the as hot-pressed disc was then ground and polished for optical and mechanical evaluation. The product exhibited a toughness value of twice that of the pure zinc sulfide subjected to the same process steps.

EXAMPLE 2

ZINC SULFIED/DIAMOND (10%) COMPOSITE

The experiment of Example I was repeated except that the composite mixture was subjected to different mixing conditions:

First, the diamond suspension was mixed not with zinc sulfide powder, but with dispersed zinc sulfide powder suspension in water; second, more intensive ultrasonic agitation was applied; and third, prolonged shear mixing (10 min. as compared to 5 min. in Example 1.) and freeze milling (5×2 min. as compared to 5 min. in Example 1.) were employed.

Figure 2:
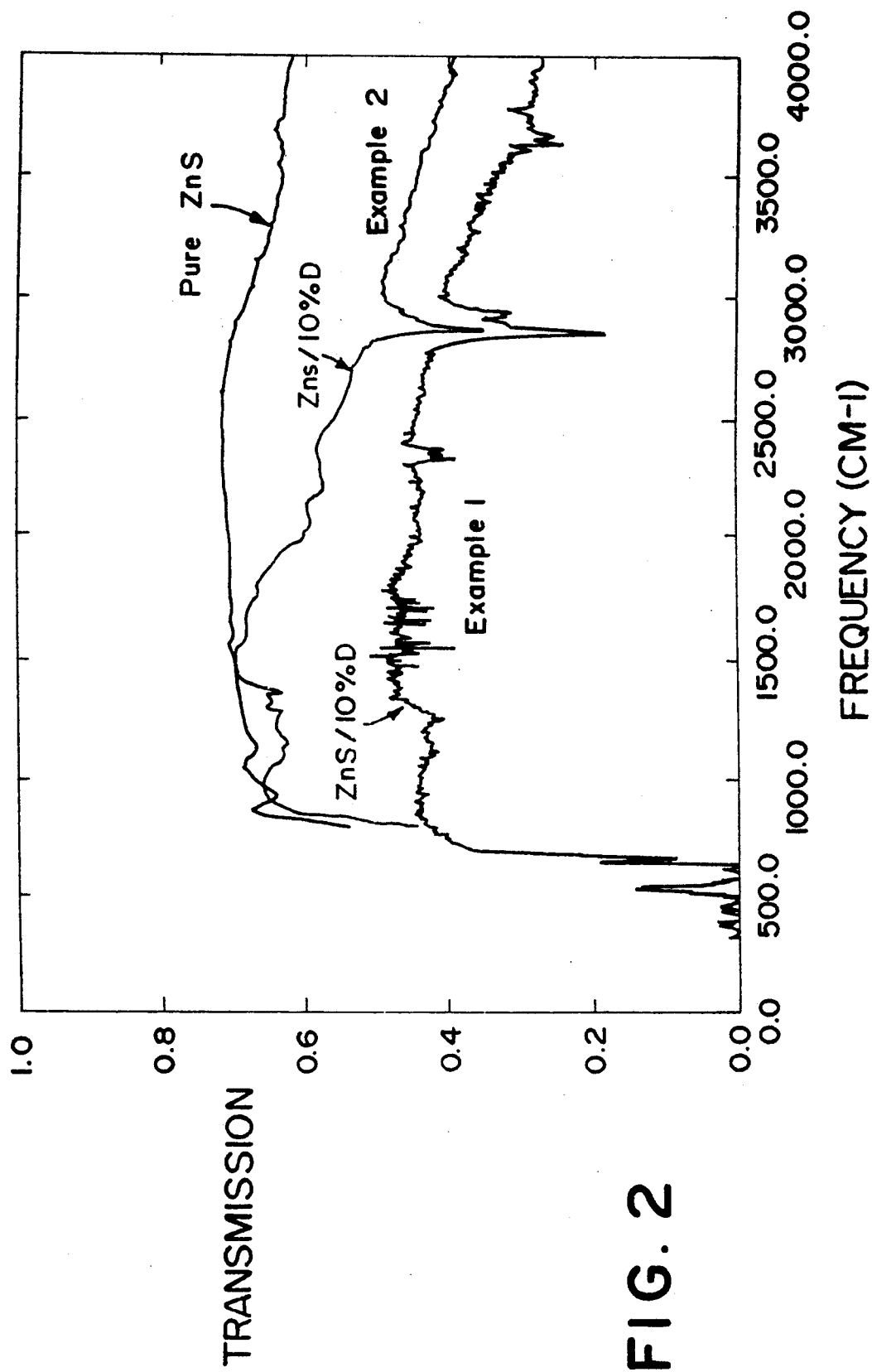
FIG. 2 is a plot of transmission (infrared) versus frequency ($cm^{-1}$) for a 10 percent diamond/zinc sulfide composite as compared with zinc sulfide alone.

The optical properties of pure zinc sulphide and the diamond composite are compared in FIG. 2 for the ten weight fraction diamond compositions. Note that the transmittance of the composites is equal to that of pure zinc sulphide. The improvement in the optical properties of the product of Example 2 versus that of Example 1 is the result of better mixing of the zinc sulphide and diamond powders.

Figure 3A:
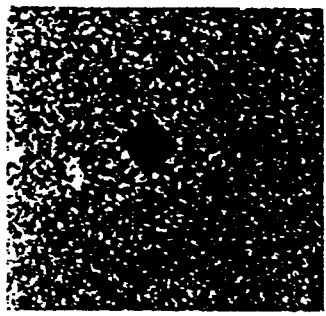
FIGS. 3A and 3B are illustrations of micrographs of indentation tests on the zinc sulfide/diamond (10%) composite of Example 2 showing microindents from which the microtoughness values were calculated.
Figure 3B:
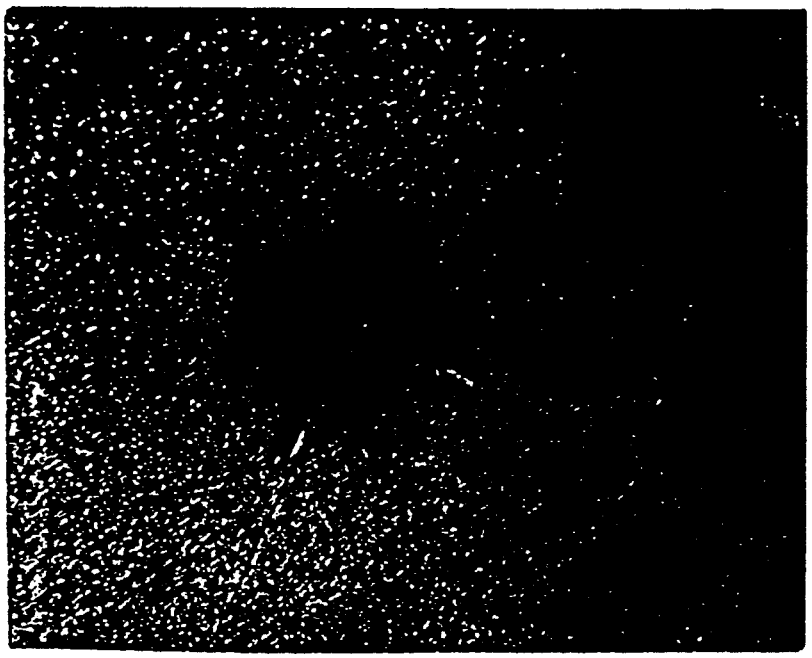

The mechanical properties of the composite and the pure zinc sulphide were characterized by the microindentation method. An example is shown in the micrograph in FIG. 3A and 3B. The fracture toughness may be estimated by the relationship between the crack length produced by the indentation and the load applied to the indentation (G. R. Anstis, P. Chantikul, B. R. Lawn and D. B. Marshall, "A Critical Evaluation of Indentation Techniques for Measuring Fracture Toughness: I, Direct Crack Measurements," J. Am. Ceram. Soc. 64, No. 9, 1981, pp. 533-538) which is as follows:

$$K_{Ic} = (0.016 \pm 0.004)\left(\frac{E}{H}\right)^{1/2} \frac{P}{C^{3/2}}$$

where $K_{IC}$ is the fracture toughness, E is the Yongs Modulus, H is the Hardness, P is the indentation load, and c is the crack length. The hardness of pure zinc sulphide and the diamond composite were found to be equal. The validity of the above equation is established by the data plotted in FIG. 4 where P is found to be proportional to $c3/2$. The ratio of the slopes for the composite and the pure zinc sulphide gives the following result:

$$\frac{K_{IC}(10\% \ D)}{K_{IC} \ (\text{pure ZnS})} = 2$$

that is, the toughness of the ten volume percent diamond composite is two times greater than the toughness of pure zinc sulphide.

EXAMPLES 3 AND 4

Figure 4:
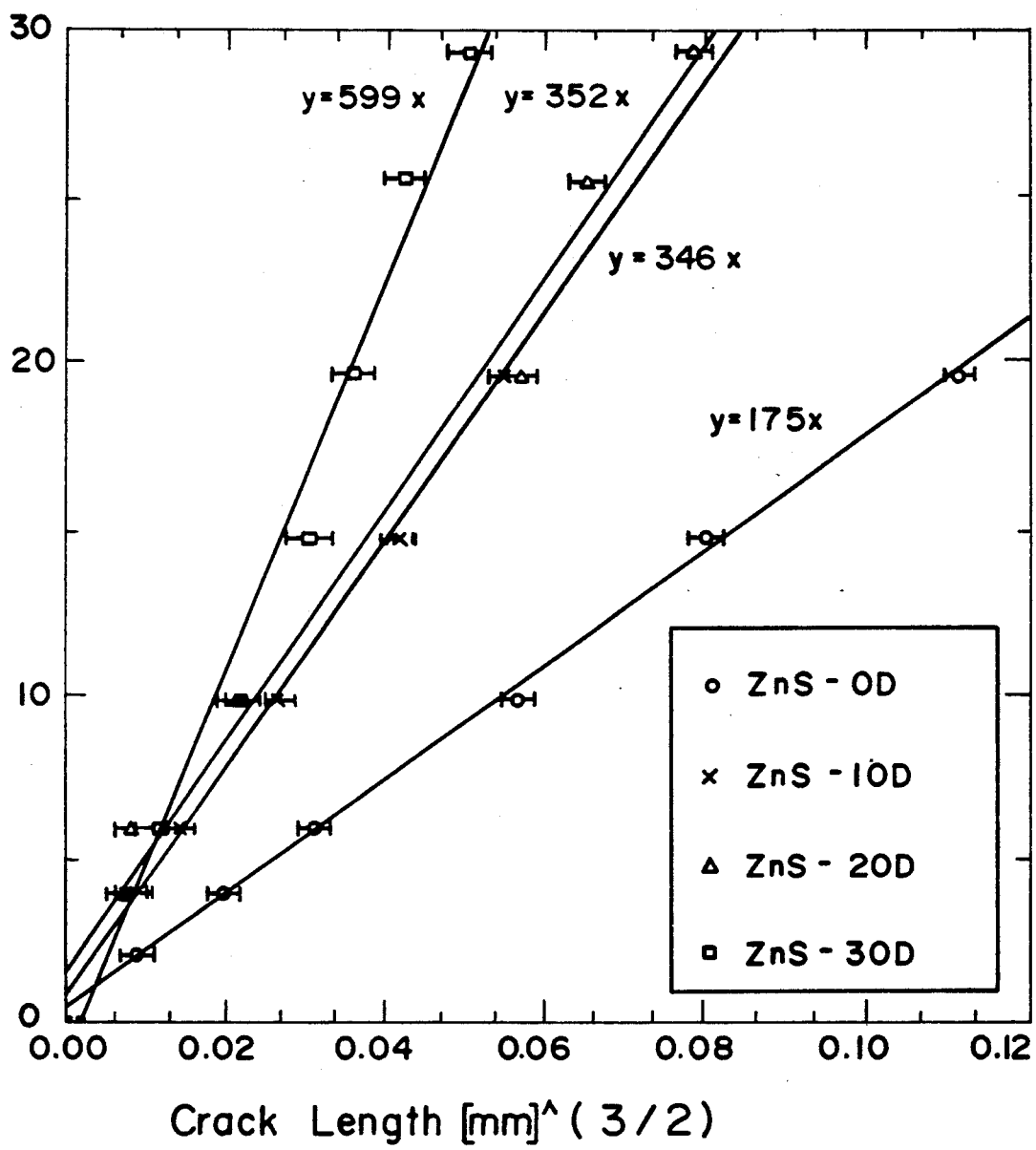
FIG. 4 is a plot showing the progressive increase in toughness with increase of diamond fraction over the range 0–30 percent diamond (i.e., for 0%, 10%, 20% and 30% diamond) using a zinc sulfide matrix.

The experiment of Example 2 was repeated except that the diamond concentration was increased to 20 and 30 weight percent respectively. The results are shown in FIG. 4. FIG. 4 is a plot comparing the toughness value of composites having 10, 20 and 30 weight percent diamond with pure zinc sulfide. It is seen that there is a progressive increase in toughness as the diamond content is increased. The toughness values for the 30 percent composite is four times that of the pure zinc sulfide.

EXAMPLE 5

If the experiment of Example 2 is repeated using 0.5 μm diameter zinc selenide in place of zinc sulfide, the resulting diamond dispersed composite will transmit infrared light in the 8 to 15 micrometer range and will exhibit increased toughness over material prepared from pure zinc selenide.

EXAMPLE 6

A diamond film about 1.0 micrometer in thickness will be deposited on the zinc sulfide composite of Example 2 by microwave plasma chemical vapor deposition using methane (5.0%), oxygen (2.0%) and hydrogen (93.0%) at a deposition temperature of 800° C. and a total gas pressure of 100 Torr.

What is claimed is:

1. A diamond coated article comprising a uniform film of diamond deposited on a composite comprising a three dimensional matrix having uniformly dispersed throughout at lateral distances from about 0.01 to about 5.0 μm finely divided diamond particles at a volume concentration of from 0.1 to about 75 percent wherein the said finely divided diamond particles have a particle size of from about 0.01 to about 5.0 micrometer diameter; the matrix has a particle size of from about 0.5 micrometer to about 50 micrometer; and wherein said matrix transmits infrared light at wavelengths from about 1 to at least 10 micrometers and said composite transmits infrared light at wavelengths from about 8 micrometers to about 15 micrometers.

2. The coated article of claim 1 wherein the matrix comprises alloys and compounds derived from the following elements: zinc, selenium, thallium, arsenic, thorium, sulfur, fluorine, iodine, chlorine and bromine, phosphorous and oxygen.

3. The coated article of claim 2 wherein the diamond has a particle size of from about 0.1 to about 5.0 micrometer diameter, the matrix has a particle size of from about 0.5 micrometer to about 50 micrometer, and the diamond is dispersed in the matrix at from about 1 to about 30 volume percent.

4. The diamond coated article of claim 3 wherein at least one surface of the composite on which the diamond film is deposited has diamond nuclei uniformly positioned on the surface at lateral distances of from about 0.5 to 2.0 μm.

5. The coated article of claim 4 wherein the diamond film is deposited on at least one surface of the composite by chemical vapor deposition.

6. The coated article of claim 4 wherein said matrix has a refractive index of from about 2.10 to about 2.60.

7. The coated article of claim 1 wherein said matrix is selected from the group consisting of one or more of the following: zinc sulfide, zinc selenide, barium monosulfide, calcium sulfide, calcium fluoride, magnesium sulfide, cadmium telluride, gallium arsenide, thorium chloride, thorium iodide, thorium tetrafluoride, arsenic trisulfide and tin iodide.

8. The coated article of claim 7 wherein the matrix is zinc sulfide.

9. The coated article of claim 7 wherein the matrix is zinc selenide.

10. The diamond coated article of claim 7 wherein the matrix is a zinc sulfide-zinc selenide alloy.

11. The coated article of claim 1 wherein the matrix comprises compounds formed from the III and V group elements of the periodic table of elements.

12. The coated article of claim 1 wherein the matrix comprises compounds formed from the II and VI group elements of the periodic table of elements.

* * * * *